(12) United States Patent
Lauriello

(10) Patent No.: US 7,297,875 B2
(45) Date of Patent: Nov. 20, 2007

(54) FUSION BONDED ASSEMBLY WITH ATTACHED LEADS

(75) Inventor: Philip J. Lauriello, Holmdel, NJ (US)

(73) Assignee: Merrimac Industries, Inc., West Caldwell, NJ (US)

( * ) Notice: Subject to any disclaimer, the term of this patent is extended or adjusted under 35 U.S.C. 154(b) by 0 days.

(21) Appl. No.: 10/833,711

(22) Filed: Apr. 27, 2004

(65) Prior Publication Data

US 2005/0236178 A1    Oct. 27, 2005

(51) Int. Cl.
*H05K 1/03* (2006.01)
(52) U.S. Cl. .................. 174/255; 174/257; 174/259; 174/262; 174/263
(58) Field of Classification Search .......... 174/255, 174/257, 259, 262, 263; 333/116
See application file for complete search history.

(56) References Cited

U.S. PATENT DOCUMENTS

| | | | | |
|---|---|---|---|---|
| 5,235,496 A | * | 8/1993 | Chomette et al. | ........... 361/764 |
| 6,040,739 A | * | 3/2000 | Wedeen et al. | ........... 330/66 |
| 6,099,677 A | * | 8/2000 | Logothetis et al. | ......... 156/253 |
| 6,316,733 B1 | * | 11/2001 | Ichitsubo et al. | ............ 174/255 |
| 6,395,374 B1 | * | 5/2002 | McAndrew et al. | ........ 428/138 |
| 6,501,031 B1 | * | 12/2002 | Glovatsky et al. | .......... 174/262 |
| 6,633,005 B2 | * | 10/2003 | Wang et al. | ................ 174/260 |
| 6,707,348 B2 | * | 3/2004 | Ammar | ....................... 333/26 |

* cited by examiner

*Primary Examiner*—Dean A. Reichard
*Assistant Examiner*—Hoa C Nguyen
(74) *Attorney, Agent, or Firm*—Drew M. Wintringham, Esq.

(57) ABSTRACT

A signal processing module can be manufactured from a plurality of composite substrate layers, each substrate layer includes elements of multiple individual processing modules. Surfaces of the layers are selectively metalicized to form signal processing elements when the substrate layers are fusion bonded in a stacked arrangement. Prior to bonding, the substrate layers are milled to form gaps located at regions between the processing modules. Prior to bonding, the leads are positioned such that they extend from signal coupling points on said metalicized surfaces into the gap regions. The substrate layers are then fusion bonded to each other such that the plurality of substrate layers form signal processing modules with leads that extend from an interior of the modules into the gap areas. The individual modules may then be separated by milling the substrate layers to de-panel the modules.

17 Claims, 5 Drawing Sheets

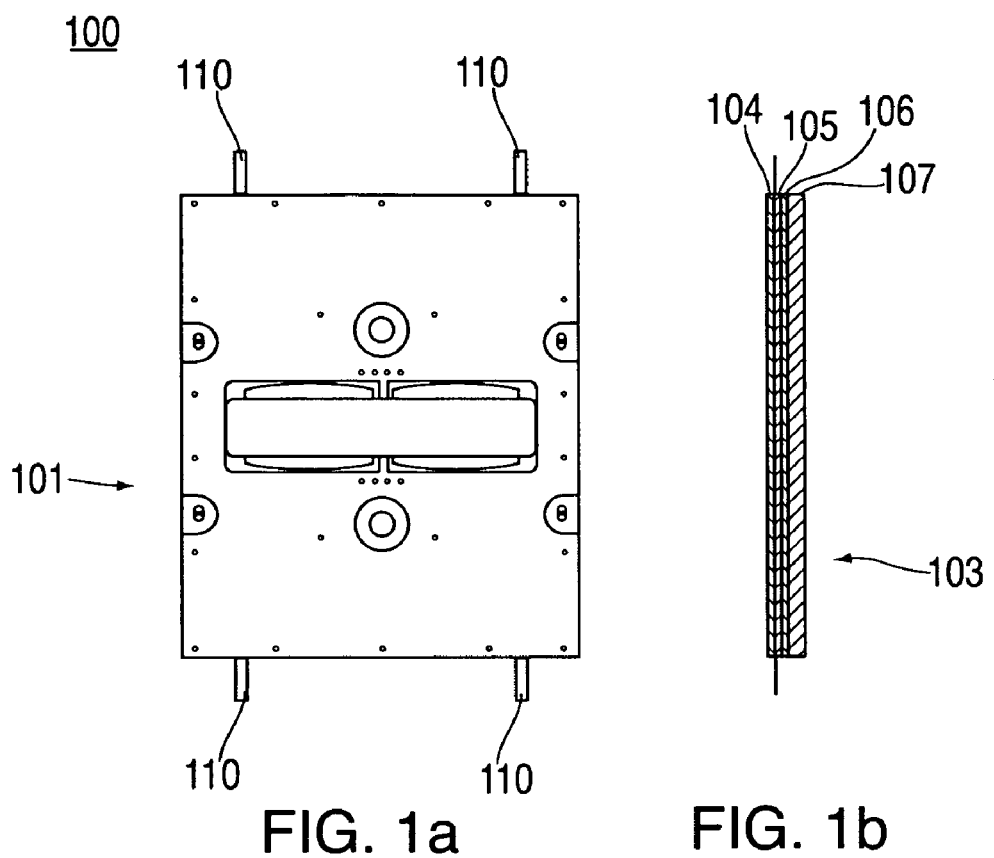
FIG. 1a
FIG. 1b
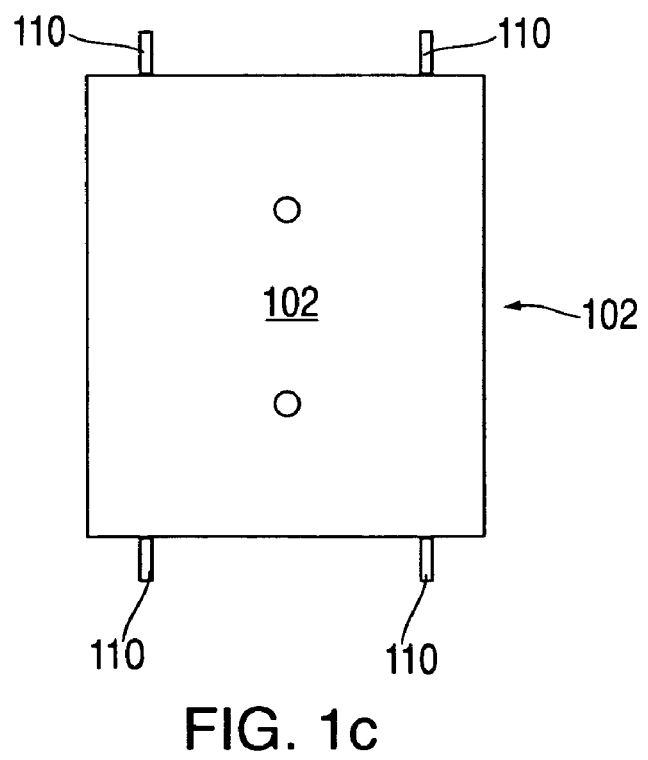
FIG. 1c

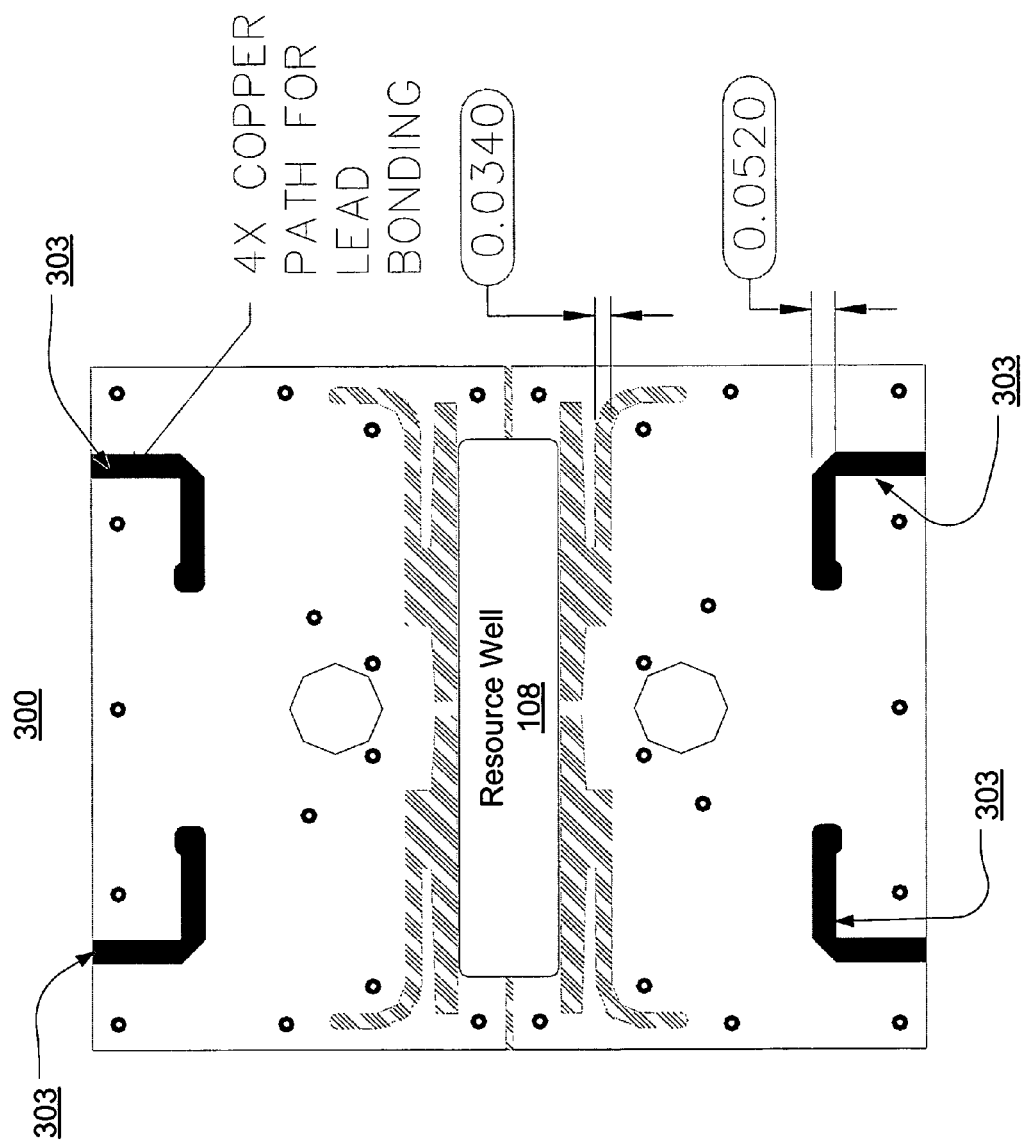

FUSION BONDED ASSEMBLY WITH ATTACHED LEADS

BACKGROUND OF THE INVENTION

The development of planar transmission media in the early 1950's had a major impact on microwave circuit and component packaging technology. The engineering of the microwave printed circuit and the supporting analytical theories for stripline and microstrip occurred at a rapid pace. The early years of stripline circuit design were devoted almost entirely to the design of passive circuits such as directional couplers, power dividers, filters, and antenna feed networks. Early implementations were housed in bulky metal housings and connected by coaxial connectors.

To reduce size and weight, case-less and connector-less couplers were developed. These later implementations were sometimes referred to as "filmbrids" and included laminated stripline assemblies bonded together by fusion, or with thermoplastic or thermoset films. Further refinements continued in areas such as the dielectric materials used in these devices and the microwave-circuit fabrication process itself. A historical perspective on the development and applications of microwave integrated circuits, can be found in "Microwave Integrated Circuits—An Historical Perspective", H. Howe, Jr., IEEE Trans. MTT-S, Vol. MTT-32, pp. 991-996; September 1984; and "Microwave Printed Circuits—The Early Years", R. M. Barrett, IEEE Trans. MTT-S, Vol. MTT-32, pp. 983-990; September 1984.

Stripline and microstrip components have been integrated for various applications in housings and packages, as well as monolithically on a common substrate. Methods of integration and packaging affect the system interface and installation, as well as the module's ability to handle post-processing temperatures (i.e., post-manufacture of the stripline or microstrip component), and the module's operating thermal management ability (i.e., its heat transfer ability). Common techniques for integrating components call for bonding them together using, e.g., epoxies, adhesives and solder. Leads may be attached to the modules after bonding to provide for signal coupling to external signal sources. Generally speaking, prior techniques of lead attachment have provided for attachment of the leads after bonding.

SUMMARY OF THE INVENTION

A circuit module formed by a fusion bonding process wherein leads are attached to internal layers of the module during the fusion bonding process is disclosed. The attached leads are used to couple internal components of the module, e.g., microwave couplers, DC blocking structures, impedance matching networks, bias decoupling structures and RF load terminations to external signal sources.

In one implementation, the coupling assembly includes multiple composite substrate layers fusion bonded together in a stacked arrangement. The substrate layers can include embedded signal processing circuitry configured for connection to a signal input and a signal output. Prior to bonding of the composite substrate layers, signal leads are positioned in contact with the input and output signal paths on internal substrate layers. The leads are positioned such that, following bonding and de-paneling of the fusion bonded layers, the leads will extend external to the module to enable signal coupling between signal paths on the composite substrate layers and external sources.

In some implementations, the coupling module can be a multi-layer module architecture that can include multiple circuit layers fusion bonded to a metal flange and a device attachment area referred to as a "resource well" or a "cavity" through the substrate layers. This resource well allows the addition of devices to the module, and coupling of those devices to circuitry in the resource module, after the module itself has been formed. The formation of a coupling module with a "resource well" is further described in co-pending application Ser. No. 10/659,542. In such implementations, additional devices can be added into the resource well after the layers of the resource module have been fusion bonded. In some implementations, the resource well includes attachment points within the well whereby an added device can be signal-connected to coupler circuitry formed in the resource module's dielectric layers.

Implementations may provide one or more of the following advantages. The pull strength, i.e., the load to pull the leads out from the part may be significantly improved. Strength is provided by both the welds of the lead to the printed circuit path and the fusion bond of the lead to the PTFE. The latter is modulated by the depth of the slots cut into the interfacing innerlayer. Leads bent perpendicular to the part can be easily restored to original position without adverse effect on performance of the part. Different leads can be attached to different innerlayers within the part.

The details of one or more implementations of the invention are set forth in the accompanying drawings and the description below. Other features, objects, and advantages of the invention will be apparent from the description and drawings, and from the claims.

DESCRIPTION OF THE DRAWINGS

FIG. 1A shows a top view of an assembled signal processing module.

FIG. 1B shows a bottom view of an assembled signal processing module.

FIG. 1C shows a side view of an assembled signal processing module.

FIG. 3A shows a top layer of a dielectric substrate having lead attachment areas disposed thereon.

DETAILED DESCRIPTION OF THE INVENTION

A "resource module" structure is disclosed herein. Top, bottom and side views of the module 100 are shown in FIGS. 1A, 1B and 1C, respectively. As shown in side view 103, the resource module 100 may be fashioned from a stack of bonded substrate layers 104-106 and a metal flange layer 107. Each substrate layer may include circuitry on one or both sides. The circuitry can include, e.g., microwave directional couplers, and 3dB quadrature couplers, impedance matching networks, DC blocks, bias decoupling, and RF load terminations. The flange layer provides for mounting of the resource and for improved thermal properties. Signal coupling leads 110 are connected to circuit elements internal to the module 100 and extend external to the module.

Basic principles for design of the microwave directional couplers and 3 dB quadrature couplers circuitry is well known to those skilled in the art, and described in such papers as "Shielded Coupled-Strip Transmission Line", S. B. Cohn, IEEE Trans. MTT-S, Vol. MTT-3, No. 5, pp. 29-38;

October, 1955; "Characteristic Impedances of Broadside-Coupled Strip Transmission Lines", S. B. Cohn, IRE Trans. MTT-S, Vol. MTT-8, No. 6, pp. 633-637; November, 1960; and "Impedances of Offset Parallel-Coupled Strip Transmission Lines", J. P. Shelton, Jr., IEEE Trans. MTT-S, Vol. MTT-14, No. 1, pp. 7-15; January, 1966. These techniques may be applied to the fashioning of circuitry internal to the module 100.

The resource module may be implemented using multiple dielectric substrate layers bonded together with a thick metal flange. The substrate layers can be formed of modern composite dielectric materials, preferably composed of polytetrafluoroethylene (PTFE), glass, and ceramic. These materials have electrical and mechanical properties that are stable over wide temperature ranges, and have low loss properties that enhance performance at microwave frequencies. Coefficient of thermal expansion values close to copper allow the formation of reliable plated-through holes and slots. These plated-through features are used to connect conducting layers into stacked stripline structures as well as to form separated groundplanes. Ground slots can be formed in mathematical proximity to signal holes through the dielectric layers to form slab transmission lines maintaining a controlled impedance for propagation in the Z direction (i.e., from top to bottom through the layers of the stacked dielectric layer structure).

Figure 2:
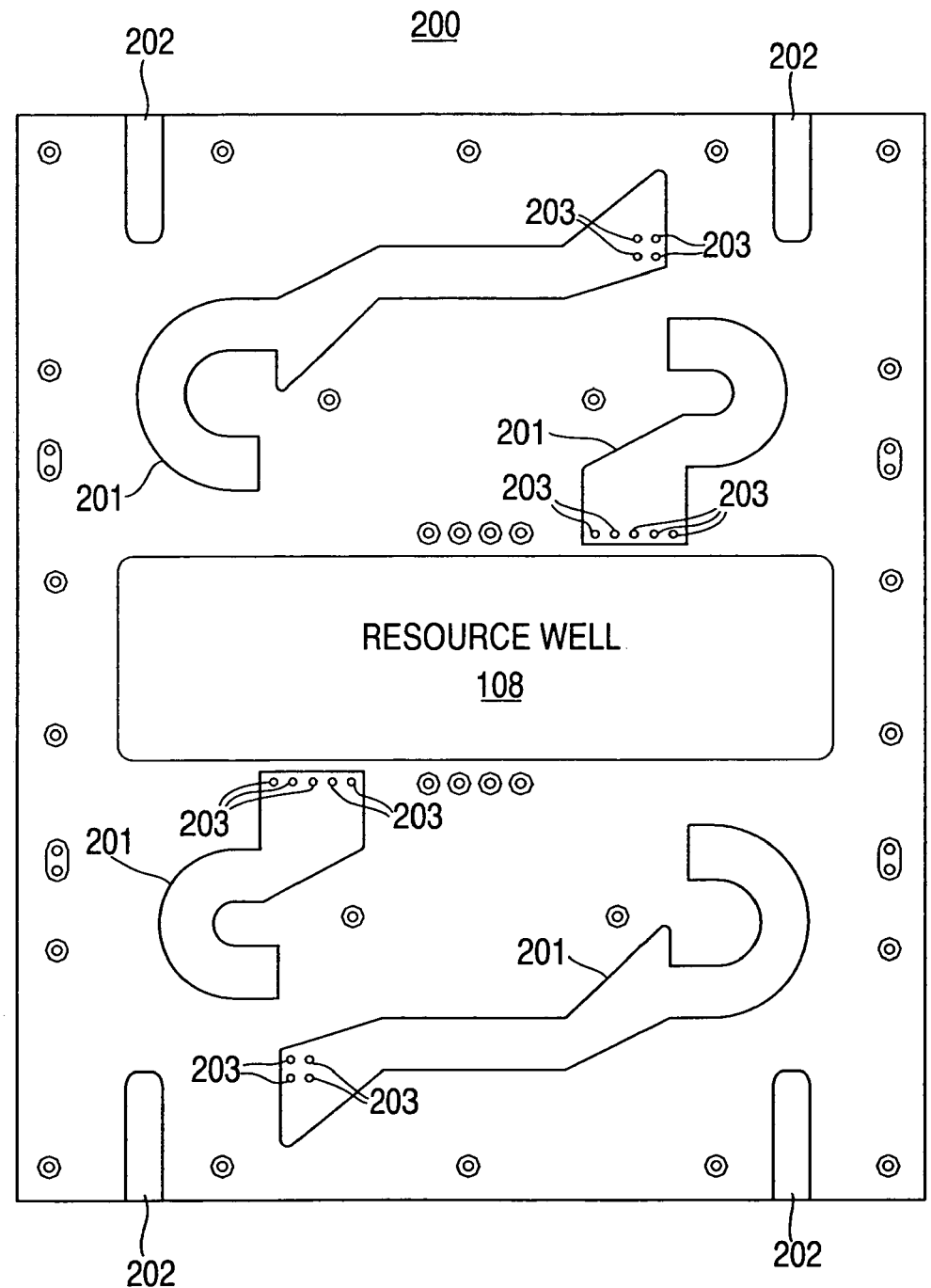
FIG. 2 shows a top layer of a dielectric substrate having signal processing circuitry disposed thereon.
Figure 3B:
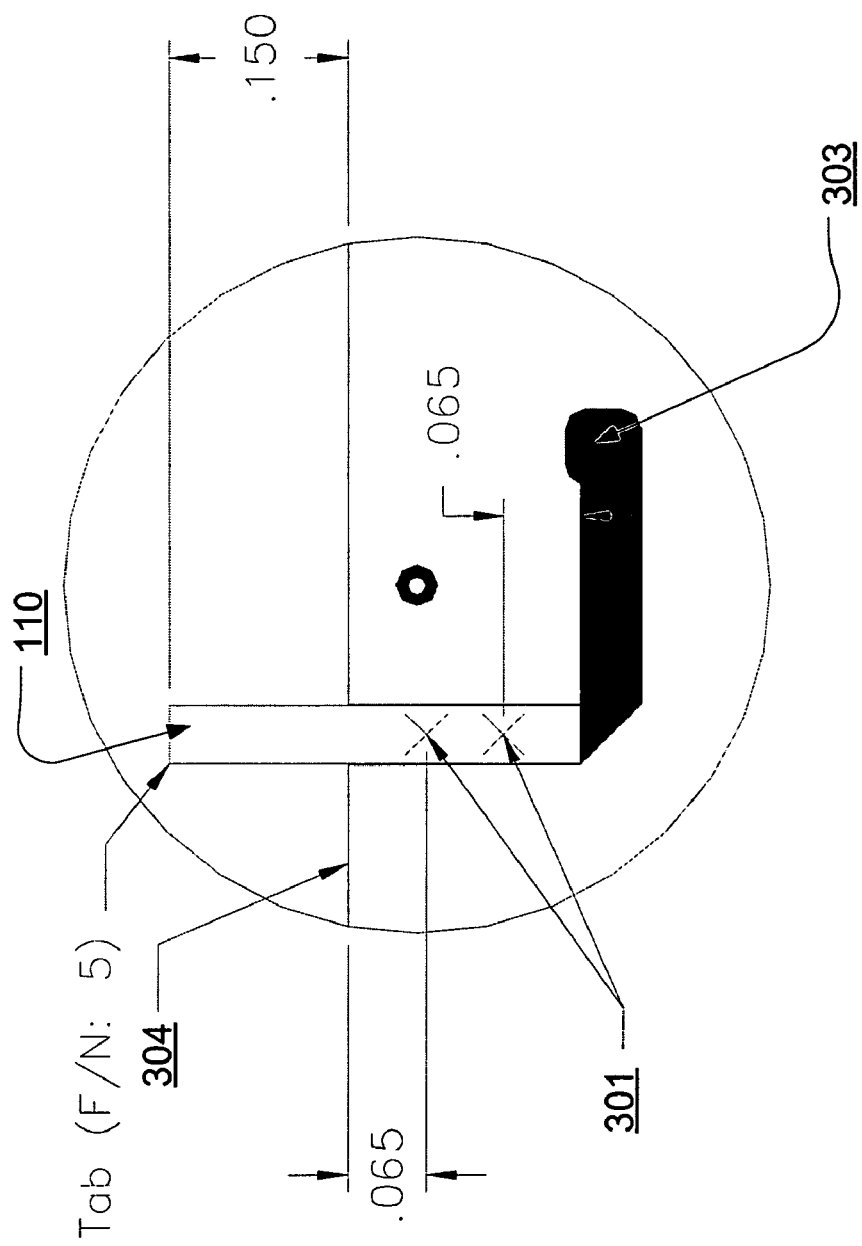
FIG. 3B shows an enlarged view of a section of the surface 300 (FIG. 3A) with leads attached thereto.
Figure 4:
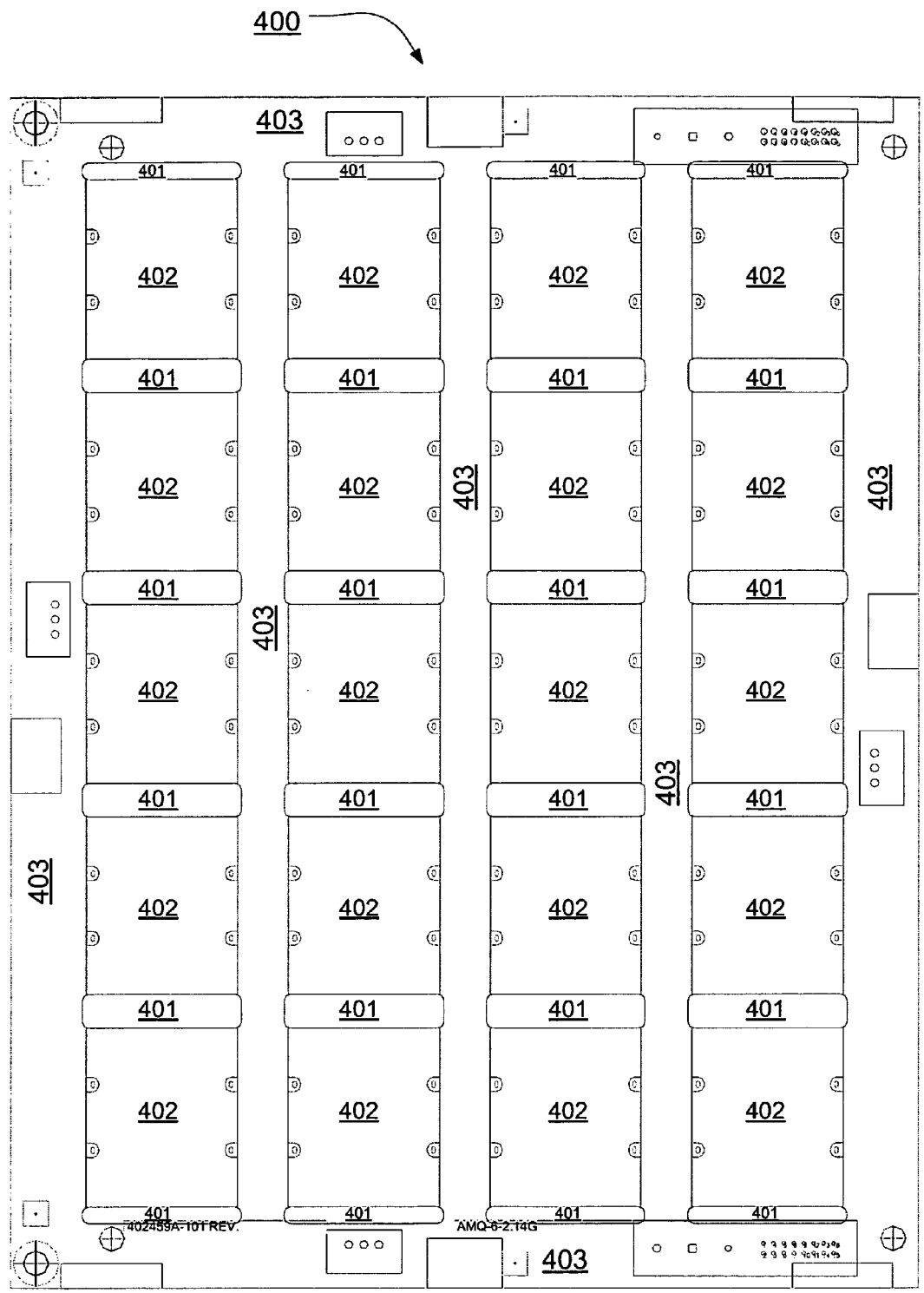
FIG. 4 shows a panel array.

FIG. 2 shows a top view 200 of one of the module's composite substrate layer 105 and FIG. 3A shows a top view of another one of the module's composite substrate layers 106. In one embodiment, the substrate layers are formed from composites of polytetrafluoroethylene, glass, and ceramic, having a range of relative dielectric constants (Er) from 2.1 to 20.0, and a range of thickness (h) from 0.005 to 0.060 inches. The substrate layers are metalized with copper foil (typically 0.0007 inches thick, but may range from 0.0001 to 0.003 inches), and etched to form circuit elements (e.g., circuit elements 201). The copper foil is used to form, e.g., coupling structures, resistors, capacitors, and other circuit elements. Via holes and slots 203 (i.e., elongated holes and openings), plated with copper, connect one substrate layer to another. For example, circuit elements 201 formed on a first substrate layer 105 may be connected by via holes to conductive paths 303 on a surface 300 of another substrate. The modules are fabricated in array panels as shown in FIG. 4.

The modules described in this disclosure can be fabricated following the processes more fully disclosed in U.S. Pat. No. 6,099,677 (the '677 patent) and U.S. Pat. No. 6,395,374 (the '374 patent), incorporated herein by reference. Following this process, the substrate layers 104-106 and, optionally, a thick metal flange 107 are bonded together, directly, by a fusion process, which utilizes a specific profile of temperature and pressure to change the material's state, and form a homogeneous dielectric, while also permanently attaching the dielectric to the thick metal flange. Fusion bonding of a thick metal flange directly to the dielectric layers provides a mechanical mounting interface for system installation. As disclosed herein, the process described in the '677 and '374 patents is enhanced by use of a lead attachment process providing for the secure attachment of the leads 110 during the fusion bonding of the substrate layers 104-106. In some implementations, the module 100 may also include a "resource well" 108 allowing for device mounting directly to a flange 107 or to a dielectric layer surface with thermal vias conducting heat to the flange. The formation of the resource well 108 and flange is described in detail in co-pending application Ser. No. 10/659,542, filed on Sep. 10, 2003.

Formation of the resource module will now be described. The flange plate layer 107 and each of the substrate layers 104-106 can be manufactured as disclosed in the '677 patent and the '374 patent and co-pending application Ser. No. 10/659,542, as those processes are further modified based on the lead attachment process described below. Generally speaking, following the manufacture of the substrate layers, and before fusion bonding, leads 110 are positioned in contact with copper paths 303, and the bonding of the substrate layers is then undertaken. By way of example, leads 110 are attached to metallic paths 303.

Attachment of Leads to Substrate Layers

1. Leads are cut to proper length and width from a conductive material. In a preferred embodiment, the leads are formed from Kovar™ finished with gold over nickel. Lead length, thickness and width are dependent on the application. By way of example, successful welding results have been achieved using, e.g., gold over nickel 0.005" thick Kovar leads on 0.0014" thick copper paths on PTFE materials as low as 0.015" thick.

2. Metalicized areas of substrate layer 300 are processed so as to maintain copper along paths 303 where leads are to be attached. Preferably, the attachment point widths are at least equivalent to the lead width and the copper thickness is at least 0.0014" thick.

3. Substrate layers 104-106 are then milled in all innerlayers along edges where leads are to protrude. Referring to FIG. 4, this milling removes substrate material to form gaps 401 in the substrate panel 400 between individual module areas 402. Unmilled areas 403 are retained between modules to hold the individual modules to each other during bonding.

4. Cavities (i.e., slots) 202 are then milled in mating inner substrate layers for lead clearance. The depth of the milled slots should be equal to the thickness of the lead material. Although FIG. 2 appears to show the slots 202 being milled through the entire thickness of the substrate 105, it should be noted the actual slot 202 need only be milled to a depth equal to the thickness of the lead 110. Furthermore, although for illustration purposes the position of the slot 202 is outlined on the top surface 200, the milling would take place along the bottom surface (i.e., milling would take place on the surface that is mated to the top of surface 300).

5. Leads may then be welded to copper signal paths 303 on the substrate layer 106. Although welding is a useful technique to ensure that the leads maintain proper positioning during subsequent bonding, in some implementations, the welding step may be eliminated or another positioning technique used. FIG. 3B shows example welding points 301 for attachment of a lead 110 to a copper path 303. Preferably, two welding points are used, but a single weld point may also be used (e.g., a weld at 0.065" from the edge 304 bordering the milled area 401.) For a given lead 110 and copper path 303 width, lead 110 and copper 303 thickness dictate weld power.

6. FIG. 4 depicts a typical 4-layer stacking of substrate layers 104-106 and a flange layer 107 to form a panel containing multiple modules. Note that each surface 300 having attached leads 110 is positioned between at least layers with milled areas 401. For example, leads 110 may be between layers 105, 106, where each of the layers 105, 106 are milled with slots 401. The pre-bonding milling of the areas 401 ensures that, during a subsequent de-paneling step, modules 402 may be separated from each other without inadvertently severing the attached leads.

7. Fusion bonding, as disclosed in the '374 and '677 patents, may then be used to fuse the layers 104-107 together.

8. Individual modules 402 are then de-paneled by milling along edges not containing leads (i.e., by milling of the material 403).

A number of embodiments of the present invention have been described. Nevertheless, it will be understood that various modifications may be made without departing from the spirit and scope of the invention. Accordingly, other embodiments are within the scope of the following claims.

What is claimed is:

1. A coupling assembly comprising:
   a plurality of composite substrate layers fusion bonded together in a stacked arrangement wherein said substrate layers comprise embedded signal processing circuitry, said stacked arrangement having at least a first edge;
   at least one signal connection point internal to said stacked arrangement and formed by a signal path formed on a first one of said substrate layers internal to said stacked arrangement; and
   at least one lead attached to at least one of said substrate layers and positioned on said signal path internal said stacked arrangement, said lead extending external to said first edge of said stacked arrangements.

2. The assembly of claim 1 further comprising:
   a flange layer fusion bonded to said stacked arrangement of substrate layers, wherein said substrate layers are positioned on top of the flange layer; and
   a cavity formed through an area of the plurality of substrate layers, said cavity exposing signal connection terminals coupled to the signal processing circuitry to enable the addition of a circuit element to the assembly after the fusion bonding of the flange and substrate layers and to enable coupling of the added circuit element to the signal processing circuitry.

3. The assembly of claim 2, wherein at least two of said plurality of substrate layers are connected by plated via holes.

4. The assembly of claim 1 wherein said substrate layers further comprise a substrate layer milled to accommodate a thickness of a lead portion internal to said assembly.

5. The assembly of claim 1, further comprising a plurality of milled-through slots extending from said first edge to internal said first edge and adjacent to at least a portion of said signal path, said lead extending within at least one of said plurality of milled-through slots, wherein the depth of the milled-through slots is substantially equal to the thickness of said lead.

6. The assembly of claim 1, wherein said signal path further comprises at least one welding point, said at least one lead positioned on said at least one welding point.

7. The assembly of claim 1 further comprising at least a second edge and at least four leads, wherein a first two leads extend from external the first edge to internal the first edge and are positioned on signal paths internal the first edge, and a second two leads extend from external the second edge to internal the second edge and are positioned on corresponding signal paths internal the first edge.

8. The assembly of claim 1, wherein said signal path extends in at least two directions.

9. The assembly of claim 1, wherein said at least one lead is attached to said at least one of said substrate layers with a fusion bond.

10. The assembly of claim 1, wherein said signal path extends internally from said first edge.

11. A coupling assembly comprising:
    a plurality of fusion bonded composite substrate layers comprising embedded signal processing circuitry formed on a fluoropolymer material, said layers positioned in a stacked arrangement, said stacked arrangement having at least a first and second edge;
    at least one signal input lead attached to at least one of said substrate layers and positioned on a first signal path, said first signal path internal said fused stacked arrangement and extending on the at least one of said substrate layers, said at least one signal input lead coupled to the embedded signal processing circuitry and extending external to said first edge of the fusion bonded composite substrate layers;
    at least one signal output lead positioned on a second signal path, said second signal path internal said fused stacked arrangement and extending on the at least one of said substrate layers, said at least one signal output lead coupled to the embedded signal processing circuitry and extending external to said second edge of the fusion bonded composite substrate layers;
    wherein said signal input and output leads are in a signal coupling arrangement to the embedded signal processing circuitry.

12. The coupling assembly of claim 11 further comprising:
    a flange layer comprising a substantially homogeneous metal core fusion bonded to the plurality of composite substrate layers.

13. The assembly of claim 11 wherein the embedded signal processing circuitry comprises microwave coupler circuitry.

14. The assembly of claim 11, wherein said first and second signal path further comprises a plurality of welding points, said at least one signal input lead and at least one signal output lead are positioned on said welding points.

15. A substrate panel assembly comprising:
    a plurality of fusion bonded fluoropolymer composite substrate layers positioned in a stacked arrangement, said plurality of substrate layers comprising a plurality of separable signal processing modules, each module comprising embedded signal processing circuitry;
    a plurality of milled-through slots between edges of said separable modules, at least one of said plurality of milled-through slots adjacent to at least a portion of one of a plurality of signal paths; and
    signal leads attached to at least one of said substrate layers and positioned on said signal paths, said signal paths internal said stacked arrangement and extending on said at least one of said substrate layers, said signal leads coupled to the embedded signal processing circuitry of said separable modules such that each lead extends within at least one of said plurality of milled-through slots.

16. The panel assembly of claim 15 wherein said leads are welded to a plurality of weld points on said signal paths, wherein said weld points are positioned internal to and between layers of the separable modules.

17. The panel assembly of claim 16 wherein said leads comprise gold plated over nickel.

* * * * *